US006294933B1

(12) United States Patent
Chun et al.

(10) Patent No.: US 6,294,933 B1

(45) Date of Patent: Sep. 25, 2001

(54) METHOD AND APPARATUS FOR LOW POWER DIFFERENTIAL SIGNALING TO REDUCE POWER

(75) Inventors: Christopher Ky Chun, Austin, TX (US); Matthew Muh, Berkley, CA (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 09/495,355

(22) Filed: Feb. 1, 2000

(51) Int. Cl.[7] ....... H03K 19/0175

(52) U.S. Cl. ....... 326/86; 326/90; 326/95; 326/83; 327/391; 327/67

(58) Field of Search ....... 326/30, 82, 86, 326/90; 327/563, 65, 69, 82

(56) References Cited

U.S. PATENT DOCUMENTS

| | | | |
|---|---|---|---|
| 5,504,782 | 4/1996 | Campbell, Jr. | 375/259 |
| 5,694,060 | 12/1997 | Brunt et al. | 326/86 |
| 5,949,253 * | 9/1999 | Bridgewater, Jr. | 326/86 |
| 5,977,796 * | 11/1999 | Gabara | 326/86 |
| 5,986,473 * | 11/1999 | Krishnamurthy et al. | 326/83 |
| 6,025,742 * | 2/2000 | Chan | 327/108 |
| 6,111,431 * | 8/2000 | Estrada | 326/83 |

OTHER PUBLICATIONS

Hui Zhang et al., "Low–Swing Interconnect Interface Circuits", University of California at Berkeley, E–mail address, hui@eecs.berkeley.edu; 6 pgs.

* cited by examiner

*Primary Examiner*—Michael Tokar
*Assistant Examiner*—Vibol Tran

(57) ABSTRACT

A low power differential signaling technique for reducing power in CMOS circuits. An input signal is provided to the input of a transmitter which uses transitions of the input signal to switch between two complementary resistive paths between upper and lower voltages across a common resistive element to develop a differential signal pair. In particular, during a high transition, a first pair of resistive switches are coupled across the common resistor causing current flow in a first direction and, during a low transition of the input signal, a second pair of resistive switches are coupled across the same common resistive element to cause current to flow in the opposite direction. The switching action converts a single-ended input signal to a differential signal pair across the common resistive element. The voltage swing across the differential signal pair is reduced to less than one half of the voltage differential between the upper and lower voltages which represent the source voltages. A receiver converts the differential signal pair back to a single-ended output voltage signal. The conversion of the single-ended input signal to a differential signal pair with a reduced voltage swing provides substantial power savings without the necessity of a voltage reference and further achieves the benefit of increased immunity to common mode noise.

14 Claims, 3 Drawing Sheets

METHOD AND APPARATUS FOR LOW POWER DIFFERENTIAL SIGNALING TO REDUCE POWER

FIELD OF THE INVENTION

The present invention relates to reducing power consumption of electric circuits, and more particularly to a low power differential signaling technique that converts single-ended signals to differential signals to reduce power consumption.

DESCRIPTION OF RELATED ART

CMOS (complementary metal oxide semiconductor) technology is generally used for low powered devices such as low power microprocessors, and microcontrollers, and also for low power computing devices including laptop or handheld computers or the like. Although CMOS technology is generally lower in power compared to other technologies such as bi-polar devices, CMOS circuits still consume a considerable amount of power during switching. At higher frequencies, the power consumption becomes significant and problematic. This is particularly true for clock circuits, which can consume 40%–50% or more power of the overall electronic circuit. CMOS circuitry is generally comprised of P channel and N channel transistors that can be configured to operate as any type of basic electronic circuit device, such as resistors and capacitors and may further be implemented as basic logic devices, such as buffers, inverters, gates, etc. CMOS logic devices generally comprise complementary P/N channel transistor pairs coupled to perform switching functions.

The average power consumption of a standard CMOS circuit is the summation of four different types of power loss, including leakage power, static power, dynamic power, and short circuit power. The leakage power is a result of leakage current through a CMOS device that is supposedly turned off. Leakage power is a characteristic of the particular CMOS technology being used and is usually negligible. The static power is the power loss that occurs when no signal is propagating through the circuitry. The static power loss can be reduced or otherwise eliminated by avoiding the use of circuits which always use current for proper biasing. The dynamic power results from current flow through parasitic capacitances of the devices along the signal traces of the circuit on a chip or printed circuit board (PCB) and is generally responsible for the largest consumption of power in the circuit. The short circuit power results when both complimentary transistors of a switch are partially on resulting in a resistive path to ground. The short circuit power occurs during switching and may be reduced with faster switch operation.

Consumers are constantly demanding greater functionality and convenience. To achieve greater functionality, the designer must pack a greater number of circuit devices into the same or smaller area and operate the circuitry at a higher frequency. A significant amount of convenience is achieved by enabling the circuitry to operate using battery power for longer periods of time. Since it is desired to also reduce the battery size, it is necessary to reduce power consumption to allow a smaller battery to be used. However, higher frequency operation results in a higher power consumption for both the dynamic and short circuit types of power loss. Circuit designers are also faced with the challenge of maintaining signal. integrity throughout the circuit. Signal integrity is degraded by parasitic capacitance on the signal traces and becomes greater with longer signal traces. To maintain signal integrity, many designers chain buffers together along signal traces to overcome the parasitic capacitance. However, such buffer chaining increases overhead circuitry and results in even greater power consumption. Down stream buffers must be relatively large to overcome large parasitic capacitances.

Many solutions have been proposed and used to reduce power consumption. Single ended circuit designs and techniques are often used to achieve a lower voltage swing relative to ground. The dynamic power is defined by the following equation:

$$P_{dym}=C_pV^2f$$

where $P_{dym}$ is dynamic power, $C_p$ is parasitic capacitance, V is the voltage, and f is the frequency of operation. The power supply voltage is typically defined between $V_{SS}$ (or ground) and $V_{DD}$. Thus, the dynamic power may be more specifically defined using the following equation:

$$P_{dym}=C_pV_{DD}V_{sig}f$$

where $V_{sig}$ is the voltage swing of the signal, which is typically between $V_{SS}$ and $V_{DD}$. Therefore, the single ended techniques attempt to reduce $V_{sig}$ to thereby reduce power. Single ended techniques, however, typically require an external voltage reference or a voltage reference device which increases circuit components and often requires an external source. Furthermore, voltage references must be reasonably precise which often complicates the overall design.

Differential techniques have also been attempted to reduce power. Emitter coupled logic (ECL) and current mode logic (CML) circuitry are differential technologies used for bi-polar transistor circuits. However, bipolar transistors consume a significant amount of power and are generally not applicable to CMOS. CMOS differential techniques result in increased static power loss since current always flows through the circuit regardless of whether a signal is being propagated. Differential design effectively doubles the parasitic capacitance and thus would otherwise double the dynamic power loss at the same voltage and frequency level. However, differential signals have increased immunity to common mode noise so that the differential voltage may be concomitantly reduced by at least one-half to counteract the increased parasitic capacitance. Therefore, differential techniques attempt to reduce the voltage swing of the signal to less than half the voltage supply differential to thereby result in power savings.

One particular differential technique is known as low-voltage differential signaling (LVDS). LVDS technology requires a current reference device thereby increasing circuitry complexity. LVDS further requires an external load resistor that must be relatively precise. The current reference and load resistor result in increased cost of the overall circuit. Furthermore, LVDS is standardized at approximately 350 millivolts so that power savings are limited in standard design.

It is desired to apply low power techniques to different technologies including CDR1 (0.35 microns at $V_{DD}$=5 volts), CDR3 (0.25 microns at $V_{DD}$=3.3 volts) or other high performance CMOS technologies such as HIP6 (0.18 micron at $V_{DD}$=2.0 volts) or HIP7 (0.15 micron at $V_{DD}$=1.5 volts).

DETAILED DESCRIPTION OF THE PREFERRED EMBODIMENTS

Figure 1:
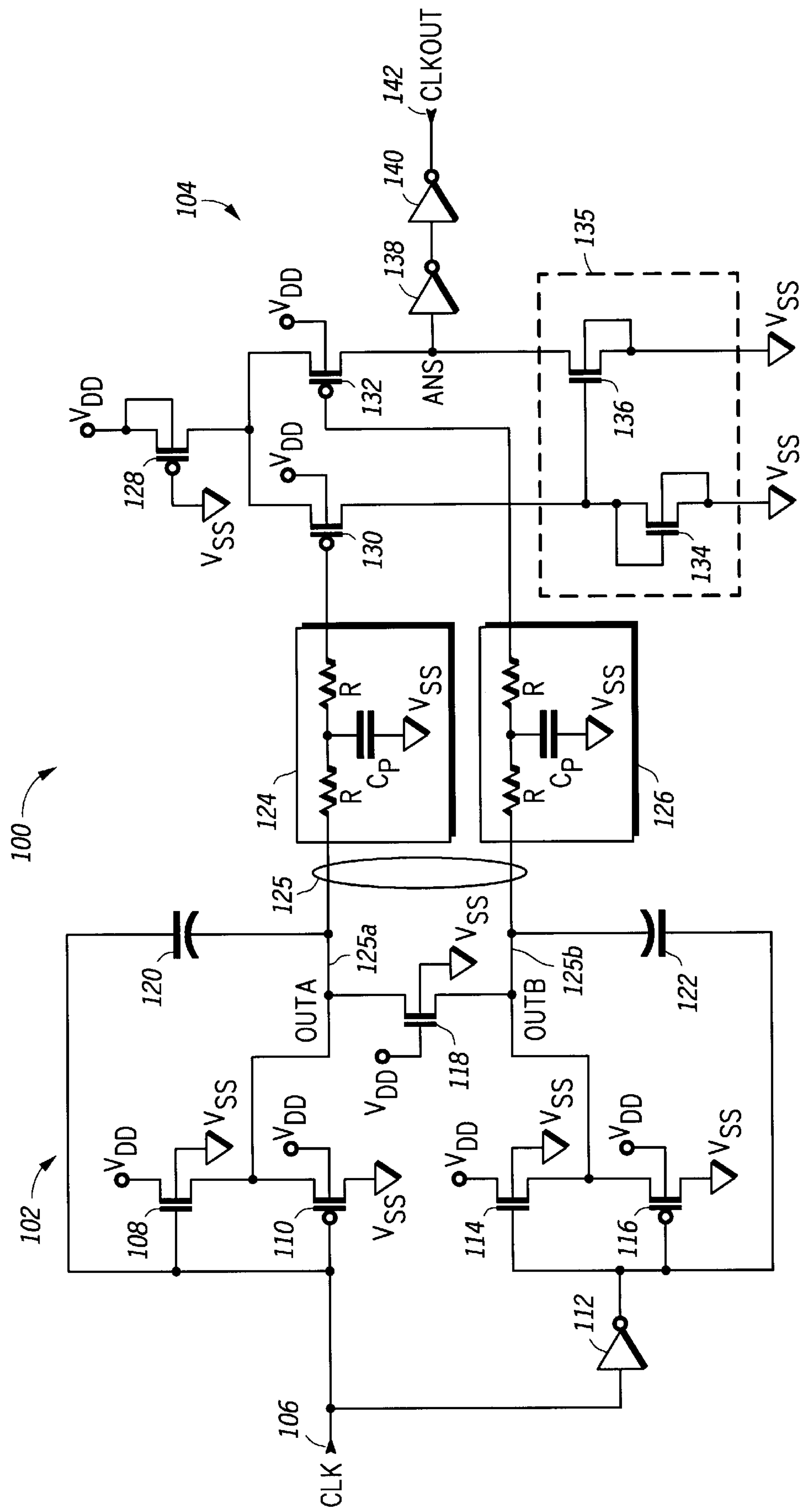
FIG. 1 is a schematic diagram of a low power differential signaling circuit implemented according to an embodiment of the present invention.

FIG. 1 is a schematic diagram of a low power differential signaling circuit 100 according to an embodiment of the present invention. The circuit 100 includes a driver or transmitter 102 coupled to a receiver 104. The circuit 100 is used for receiving a clock signal CLK at an input terminal on signal trace 106 and transmitting the CLK signal along differential signal traces 125 to provide a corresponding output clock signal CLKOUT. Although the present invention is illustrated for use in distributing a clock signal throughout a circuit, it is understood that the present invention is not limited to clock circuits, but may be generalized to propagate or transmit data signals of any type.

The transmitter 102 includes a plurality of resistive switches, such as, for example, a plurality of transistors or resistive micromachined switches on silicon. Illustrated in FIG. 1 are an N channel CMOS transistor 108 and a P channel CMOS transistor 110 for developing a first differential signal referred to as OUTA. The transmitter 102 also includes an N channel CMOS transistor 114 and a P channel CMOS transistor 116 for developing a second and complimentary differential output signal referred to as OUTB. Further, an N channel CMOS transistor 118 is coupled between the OUTA and OUTB signals and serves as a load or resistive element for developing the differential signal pair OUTA and OUTB. The transmitter 102 further includes a first speed-up or feed-forward capacitor 120 coupled between the CLK and OUTA signals, and a second feed-forward capacitor 122 coupled between the CLK and OUTB signals.

The signal traces 125 include a first output terminal or a first signal trace 125*a* for carrying the OUTA signal where the signal trace 125*a* is represented by an equivalent T circuit 124. The differential signal trace 125 further includes a second output terminal or a second signal trace 125*b* for carrying the OUTB signal, where the signal trace 125 is represented by another equivalent T circuit 126. The equivalent T circuits 124, 126 each comprise two series resistors R and a center coupled parasitic capacitance $C_P$ coupled between the junction of the resistors R and, a lower reference voltage signal $V_{SS}$ or ground.

The receiver 104 includes a P channel CMOS transistor 128 configured as a current source feeding current to two other P channel CMOS transistors 130 and 132. The transistors 130, 132 are coupled to a current mirror circuit 135 comprising two N channel CMOS transistors 134 and 136 referenced to $V_{SS}$. The receiver 104 develops an output signal ANS, which is provided to the input of an inverting buffer 138 which has its output provided to the input to another inverting buffer 140. The output of the buffer 140 provides the output CLKOUT signal on a signal trace 142.

More particularly, the CLK signal is provided to the gates of the transistors 108 and 110 and to one side of the capacitor 120. The CLK signal is also provided to the input of an inverting buffer 112. The drain of the transistor 108 is connected to an upper voltage signal $V_{DD}$ and its source is connected to the source of the transistor 110. The drain of the transistor 110 is coupled to $V_{SS}$ signal. The source junction of the transistors 108, 110 is coupled to the signal trace 125*a*, which develops the OUTA signal, and the signal trace 125*a* is further coupled to the drain of the transistor 118 and to the other side of the capacitor 120. The drain of the transistor 114 is coupled to the $V_{DD}$ signal and its source is connected to the source of the transistor 116. The drain of the transistor 116 is coupled to the $V_{SS}$ signal. The gates of the transistors 114, 116, are coupled to the output of the inverting buffer 112. The source junction between the transistors and 114 and 116 is coupled to the signal trace 125*b*, which develops the OUTB signal, where the signal trace 125*b* is coupled to the source of the transistor 118 and to the other side of the feed forward capacitor 122.

The signal trace 125*a*, as represented by the equivalent T circuit 124, is provided to the gate of the transistor 130. The signal trace 125*b*, as represented by the equivalent T circuit 126, is provided to the gate of the transistor 132. The sources of the transistors 130, 132 are coupled to the drain of the transistor 128, having its gate coupled to the $V_{SS}$ signal and its source coupled to the $V_{DD}$ signal. The drain of the transistor 130 is coupled to the drain of transistor 134. The drain of transistor 132 is coupled to the drain of transistor 136. The sources of the transistors 134 and 136 are both coupled to the $V_{SS}$ signal. The drain of the transistor 134 is also coupled to its gate and also to the gate of the transistor 136. The drain junction of the transistors 132, 136 develop the ANS signal provided to the buffer 138.

The inverting buffers 112, 138 and 140 may be implemented using CMOS devices as known to those skilled in the art. The feed forward capacitors 120 and 122 may be implemented with actual capacitors or alternatively are implemented using CMOS devices. In one embodiment, the feed forward capacitors 120, 122 are implemented with cross-coupled P channel CMOS transistors with their sources tied to ground and having cross-coupled drain and gates. Such configuration achieves symmetrical behavior of the OUTA and OUTB signals across the differential signal lines 125.

Figure 2:
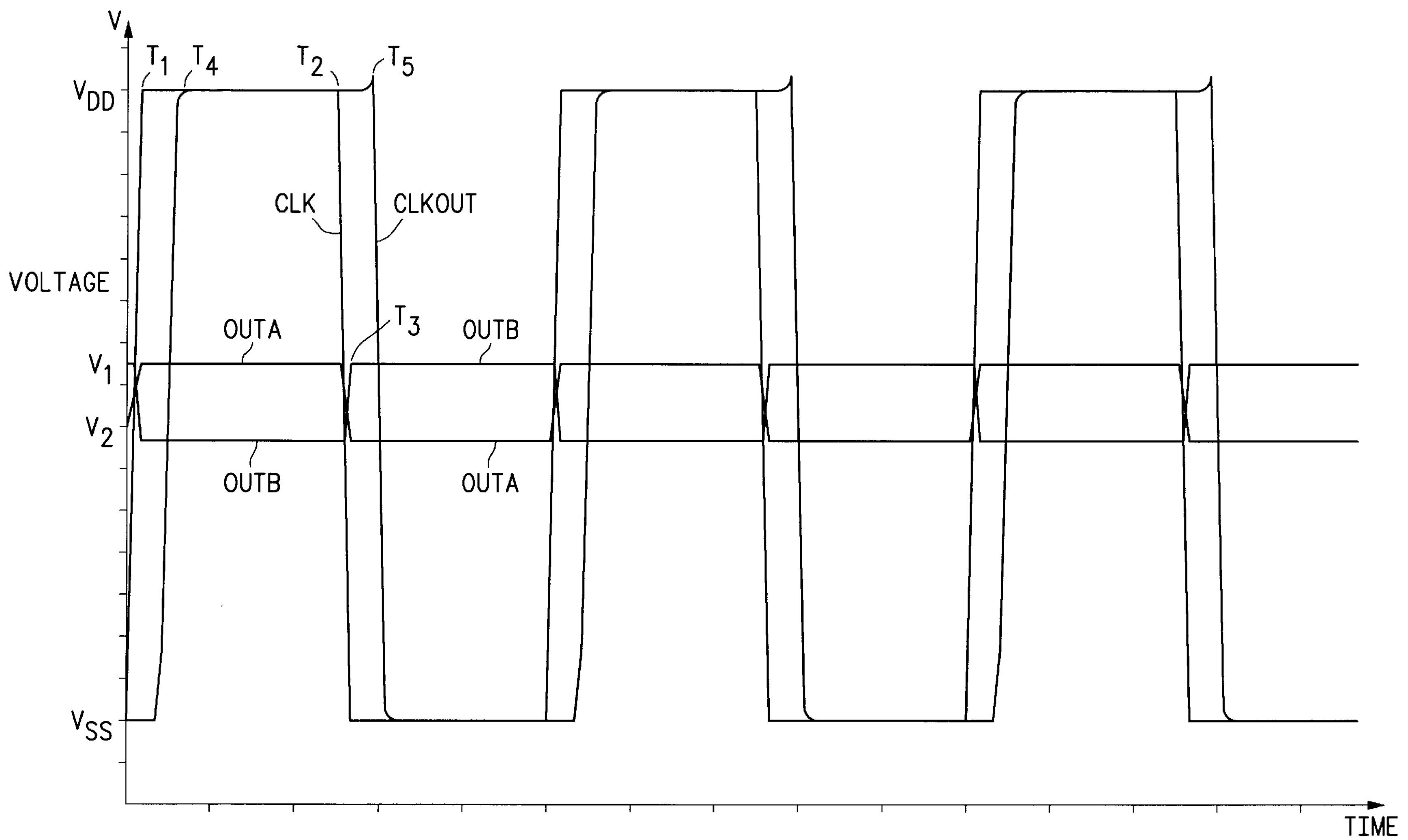
FIG. 2 is a signal diagram plotting voltage versus time that illustrates the transient behavior of the low power differential signaling circuit of FIG. 1.

Operation of the circuit 100 is now described with reference to the timing diagram shown in FIG. 2. The CLK signal is initially at $V_{SS}$ and transitions to the $V_{DD}$ voltage level at approximately time T1. The transistor 108 is turned on and the transistor 116 is also turned on through the inverting action of the inverting buffer 112. In this manner, current flows from $V_{DD}$ through transistor 108, through the resistive element transistor 118 and through the transistor 116 to $V_{SS}$. Such current flow develops the OUTA signal at a voltage level V1 and the OUTB signal at a voltage level V2 as shown in FIG. 2. The voltage differential between the OUTA and OUTB signals, or V1 minus V2, is substantially less than the voltage differential between the upper and lower voltage signals $V_{DD}$ and $V_{SS}$. The effective resistances of the transistors 108 and 116 are selected to be substantially equivalent to each other in one embodiment so that the differential voltage of the OUTA and OUTB signals are centered between the $V_{DD}$ and $V_{SS}$ signals. It is noted, however, that the present invention does not require such precise matching and allows significant variations of the effective resistances between the transistors. The voltage differential V1 minus V2 across the OUTA and OUTB signals across the transistor 118 is equal to the resistance of the transistor 118 divided by the total resistance of the transistors 108, 116 and 118 multiplied by $V_{DD}$. In one embodiment, the resistances of the transistors 108, 118 and 116 are selected so that the voltage differential between the OUTA and OUTB signals is approximately 0.2 volts. If $V_{SS}$ is ground or 0 and $V_{DD}$ is 1.5 volts, then the voltage differential V1 minus V2 is between 10 and 15% of the voltage swing of the CLK signal.

At approximately time T2, the CLK signal transitions from $V_{DD}$ to $V_{SS}$. In this manner, the transistors 108 and 116 are turned off while the transistors 110 and 114 are turned on. Thus, current flows from $V_{DD}$ through transistor 114, through transistor 118 and through the transistor 110 to $V_{SS}$. Shortly after the time T2, or at a time T3, the OUTB signal rises from voltage level V2 to voltage level V1 while the OUTA signal falls from the voltage level V1 to approximately voltage level V2. In this manner the voltage level on the OUTA and OUTB signals alternate in a complementary manner between V1 and V2 voltage levels as shown in FIG. 2. The effective resistance of the transistors 110 and 114 are selected to be substantially equivalent to each other and to the transistors 108 and 116 to establish symmetry as previously described. However, such symmetry is not necessary for proper generation.

It is appreciated that the transitions of the CLK input signal are used to switch current between two complementary resistive paths between $V_{DD}$ and $V_{SS}$ across a common resistive element, the transistor 118, to develop a differential pair of signals OUTA and OUTB. The voltage swing of the OUTA and OUTB signals is less than one-half the difference between the $V_{DD}$ and $V_{SS}$ signals.

When the OUTA signal is at voltage V1 greater than the voltage of the OUTB signal at V2, the transistor 132 is mostly turned on and at a low resistive level while the transistor 130 is mostly turned off and at a high resistive level. Since the transistor 130 is at a relatively high resistive level, it tends to reduce the amount of current flowing through transistor 128 to the current mirror 135. Since the voltage level at the gates of the transistors 134, 136 of the current mirror 135 are the same, the current mirror 135 tends to reduce the current flow through the transistor 132. Thus, the transistor 132 is at a relatively low resistance and current level resulting in a relatively small voltage drop, which tends to increase the voltage of the ANS signal. This in turn causes the CLKOUT signal to go high through the inverting buffers 138, 140 so that the CLKOUT signal is asserted high to the $V_{DD}$ level at approximately time T4. The time T4 is a relatively short delay after time T1.

When the CLK signal is asserted low at time T2, the OUTA and OUTB signals switch between the V1 and V2 signals at time T3, the transistor 130 is mostly turned on whereas the transistor 132 is mostly turned off The transistor 130 correspondingly draws a significant amount of current into the current mirror 135. The current mirror 135 tends to draw the same amount of current through the transistor 132, which also has an increased resistance. In this manner, the transistor 132 has a relatively high resistance and large current, tending to reduce the voltage level of the ANS signal. At approximately a time T5, which is short delay after time T3, the CLKOUT signal falls low from the $V_{DD}$ level to the $V_{SS}$ level.

In this manner, the CLK signal is transmitted through the differential signal lines 125 to develop the CLKOUT signal after a slight delay through the low power differential signaling circuit 100. Since the voltage across the differential signal traces 125 is substantially reduced, such as by less than one-half, as compared to the voltage swings of the CLK and CLKOUT signals, the dynamic power and thus the average power consumed for switching the clock signal is substantially reduced. The effective resistance of the transistors 108 and 116 or 110 and 114 as well as the effective resistance of the common transistor 118 is chosen to be relatively high resulting in relatively high impedance and low power. Such high impedance tends to slow the overall operation of the complementary resistive paths. The use of the feed-forward capacitors 120, 122 however, speeds operation of the circuit 100, so that the overall circuit may be operated at at least the same frequency as compared to an equivalent single-ended CMOS circuit.

Since the voltage differential across the signal traces 125 is substantially reduced, an effective power savings of 50–80% may be achieved. If used in clock circuits, which generally consume 40–50% of the whole electronic circuit, an overall savings of 20–45% is possible. At least one benefit is that the average power is substantially reduced at the same frequency. Another benefit is that no external references are necessary so that precision devices or complicated circuitry is unnecessary. The use of a resistant load in conjunction with speed-up capacitors enables sharp transitions to achieve a benefit of higher frequency operation. The use of differential signals provides the further benefit of increased immunity to common mode noise. Another benefit of the present invention is that the transmitter 102 and receiver 104 may be implemented as standard cells in a library of a computer design language such as a register transfer logic (RTL), Verilog or VHDL, to facilitate circuit design and synthesis flow.

Figure 3:
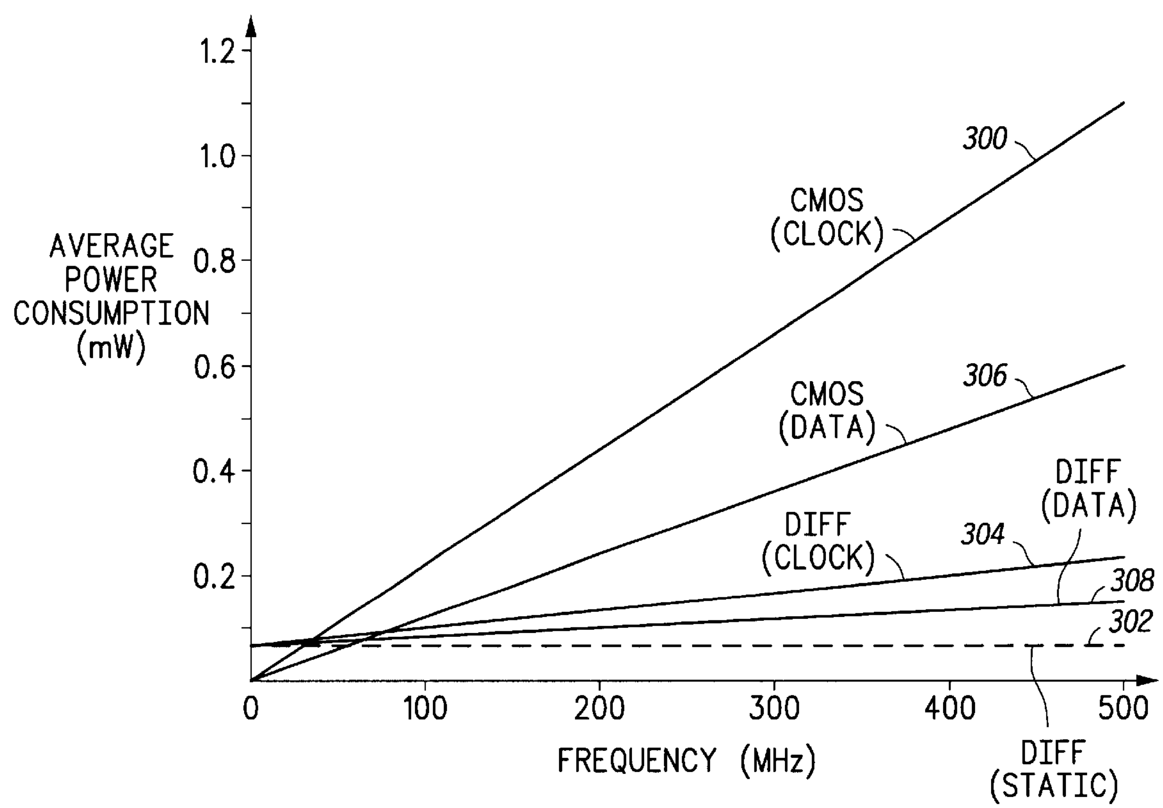
FIG. 3 is a graph plotting average power consumption versus frequency illustrating power savings of a circuit implemented according to an embodiment of the present invention.

FIG. 3 is a graph diagram plotting average power consumption vs. frequency comparing standard CMOS technology to the low power differential signaling technique according to the present invention. The frequency is plotted between 0 and 500 MHz and the average power consumption is plotted between 0 and 1.2 milliwats (mW). A standard clock circuit was implemented using standard CMOS technology and was operated between 0 and 500 MHz. The corresponding power consumed varied from 0 mW at DC up to 1.1 mW at 500 MHz as illustrated by curve 300. The same standard clock circuit was implemented using the low powered differential signaling technique implemented according to the present invention. Because of the use of differential signals, the static power loss is not zero (0) at DC and very low frequencies as represented by a differential static curve 302. Thus, the clock circuit implemented with the low power differential signaling consumed less than 0.1 mW at DC and very low frequency levels. However, the clock circuit using low power differential signaling only consumed a little over 0.2 mW when operated at 500 MHz. The crossover frequency of approximately 30 MHz illustrates that the clock circuit implemented using low powered differential signaling according to the present invention provides substantial power savings when operated above 30 MHz. For example, at 200 MHz a clock circuit implemented using the low powered different signaling technique consumes approximately 0.1 mW whereas standard CMOS circuitry consumes over 0.4 mW, which is more than four times the power consumption.

The present invention is maximized for clock circuits which utilize substantially periodic data signals. However, the present invention is applicable to any type of data circuit for reducing power at higher frequencies. As shown in FIG. 3, another data curve 306 illustrates power consumption using standard CMOS technology for a standard data circuit where the power varies from 0 to 0.6 mW when operated from 0 to 500 MHz. Another curve 308 illustrates the same standard circuit implemented using the low power differential signaling according to the present invention. The curve 308 illustrates that a differential static power loss occurs at DC and at low frequencies. However, above a crossover frequency of approximately 50–60 MHz, the data circuit implemented according to the present invention consumes less than 0.2 mW at 500 MHz as compared to 0.6 mW for the data circuit implemented using standard CMOS technology.

Figure 4:
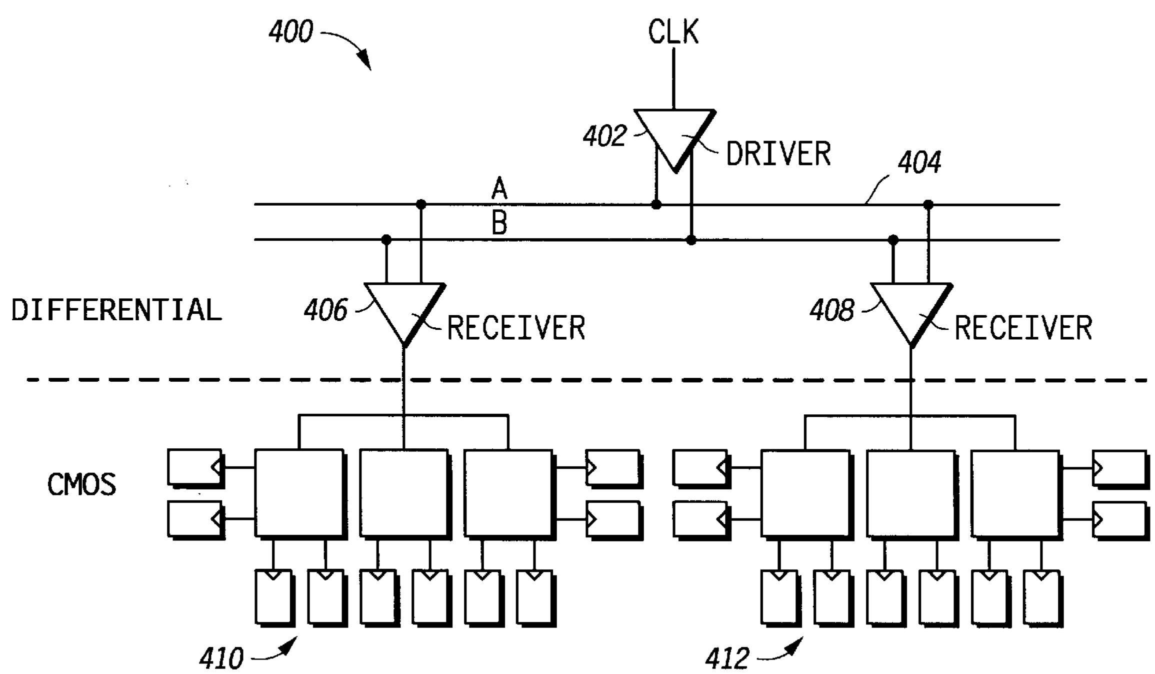
FIG. 4 is a circuit diagram illustrating a clock distribution tree using differential clock circuitry implemented according to an embodiment of the present invention.

FIG. 4 is a schematic block diagram of a clock distribution tree 400 using low powered differential signaling implemented according to the present invention. In particular, a clock signal CLK is provided to a driver 402, which is preferably implemented in a similar manner as the transmitter 102 as shown in FIG. 1. The driver 402 asserts differential signals A and B to a plurality of receivers 406, 408, etc., which are each implemented in a similar manner as the receiver 104 of FIG. 1. Each of the receivers 406, 408 asserts a corresponding CLKOUT signal corresponding to the original CLK signal asserted at the driver 402. The various CLKOUT signals asserted by the receivers 406, 408 are provided to respective circuits 410, 412 implemented using standard CMOS technology. In this manner, it is appreciated that the present invention can be used to effectively distribute a clock signal from a signal transmitter to multiple receivers at the same or greater frequency as standard CMOS technology at substantially reduced power levels. All of the same benefits described previously are achieved resulting in efficient reduce power operation.

Those skilled in the art will recognize that modifications and variations can be made without departing from the spirit of the invention. Therefore, it is intended that this invention encompass all such variations and modifications as fall within the scope of the appended claims.

What is claimed is:

1. A low power transmitter circuit for converting a single ended input signal to first and second output signals, comprising:

an input terminal for receiving the input signal;

first and second output terminals for transmitting the first and second output signals having first and second voltage levels, respectively;

a plurality of resistive switches connected to the input terminal and the first and second output terminals, the plurality of resistive switches further connected to an upper voltage and a lower voltage;

a resistive element connecting the first and second output terminals; and first and second feed-forward capacitors connected between the input terminal and the first and second output terminals, respectively, wherein a difference between the first and second voltage levels is less than one half of a difference between the upper voltage and the lower voltage.

2. The low power transmitter circuit of claim 1, wherein the first and second feed-forward capacitors include MOS transistor devices.

3. A low power transmitter circuit for converting a single ended input signal to first and second output signals, comprising:

an input terminal for receiving the input signal;

first and second output terminals for transmitting the first and second output signals having first and second voltage levels, respectively;

a plurality of resistive switches connected to the input terminal and the first and second output terminals, the plurality of resistive switches further connected to an upper voltage and a lower voltage;

a resistive element connecting the first and second output terminals; and wherein a difference between the first and second voltage levels is less than one half of a difference between the upper voltage and the lower voltage;

wherein the plurality of resistive switches comprise:

a first N-channel MOS transistor having a drain connected to the upper voltage, a gate connected to the input terminal, and a source connected to the first output terminal;

a second P-channel MOS transistor having a drain connected to the lower voltage, a gate connected to the input terminal, and a source connected to the first output terminal;

a third N-channel MOS transistor having a drain connected to the upper voltage, a source connected to the second output terminal, and a gate connected to the input terminal through an inverter; and a fourth P-channel MOS transistor having a drain connected to the lower voltage, a source connected to the second output terminal, and a gate connected to the input terminal through the inverter.

4. A low power transmitter circuit for converting a single ended input signal to first and second output signals, comprising:

an input terminal for receiving the input signal;

first and second output terminals for transmitting the first and second output signals having first and second voltage levels, respectively;

a plurality of resistive switches connected to the input terminal and the first and second output terminals, the plurality of resistive switches further connected to an upper voltage and a lower voltage; and a resistive element connecting the first and second output terminals;

wherein a difference between the first and second voltage levels is less than one half of a difference between the upper voltage and the lower voltage;

wherein the resistive element comprises:

a MOS transistor having a drain connected to the first output terminal, a gate connected to a selected one of the upper voltage and the lower voltage, and a source connected to the second output terminal.

5. A clock circuit, comprising:

a transmitter comprising:

an input terminal for receiving an input clock signal;

first and second output terminals for transmitting first and second output signals having first and second voltage levels, respectively;

a plurality of resistive switches connected to the input terminal and the first and second output terminals, the plurality of resistive switches further connected to an upper voltage and a lower voltage; and a resistive element connecting the first and second output terminals;

wherein a difference between the first and second voltage levels is less than one half of a difference between the upper voltage and the lower voltage; and a receiver circuit for converting the first and second output signals to a single ended output clock signal and first and second feed-forward capacitors connected between the input terminal and the first and second output terminals, respectively.

6. The clock circuit of claim 5, wherein the first and second feed-forward capacitors include MOS transistor devices.

7. A low power transmitter circuit for converting a single ended input signal to first and second output signals, comprising:

an input terminal for receiving the input signal;

first and second output terminals for transmitting the first and second output signals having first and second voltage levels, respectively;

a first N-channel MOS transistor having a drain connected to an upper voltage, a gate connected to the input terminal, and a source connected to the first output terminal;

a second P-channel MOS transistor having a drain connected to a lower voltage, a gate connected to the input terminal, and a source connected to the first output terminal;

an inverter connected to the input terminal an having an inverter output;

a third N-channel MOS transistor having a drain connected to the upper voltage, a gate connected to the inverter output, and a source connected to the second output terminal;

a fourth P-channel MOS transistor having a drain connected to the lower voltage, a gate connected to the inverter output, and a source connected to the second output terminal;

a fifth MOS transistor having a drain connected to the first output terminal, a gate connected to a selected one of the upper voltage and the lower voltage, and a source connected to the second output terminal; and wherein a difference between the first and second voltage levels is less than one half of a difference between the upper voltage and the lower voltage.

8. The low power transmitter circuit of claim 7, wherein the first and second output signals are differential.

9. The low power transmitter circuit of claim 7, further comprising:

first and second feed-forward capacitors connected between the input terminal and the first and second output terminals, respectively.

10. The low power transmitter circuit of claim 7, wherein the transmitter circuit is internal to an integrated circuit chip.

11. An integrated circuit chip having a low power transmitter circuit for converting a single ended input signal to first and second output signals, the transmitter circuit comprising:

an input terminal for receiving the input signal;

first and second output terminals for transmitting the first and second output signals having first and second voltage levels, respectively;

a plurality of resistive switches connected to the input terminal and the first and second output terminals, the plurality of resistive switches further connected to an upper voltage and a lower voltage;

a resistive element connecting the first and second output terminals; and first and second feed-forward capacitors connected between the input terminal and the first and second output terminals, respectively:

wherein a difference between the first and second voltage levels is less than one half of a difference between the upper voltage and the lower voltage.

12. A method for reducing power consumption in a digital circuit, comprising:

applying an input signal to the circuit;

providing an upper voltage and a lower voltage;

using a transition of the input signal to switch between two complementary resistive paths between the upper voltage and the lower voltage across a common resistive element to develop a differential signal pair having first and second voltage levels; and reducing voltage swing between the first and second voltage levels to less than one half of a difference between the upper voltage and the lower voltage;

wherein the step of increasing the speed of the differential signal pair comprises:

connecting first and second feed-forward capacitors between the input signal and the differential signal pair.

13. A clock circuit, comprising:

a transmitter circuit comprising;

an input terminal for receiving an input clock signal;

first and second output terminals for transmitting first and second output signals having first and second voltage levels, respectively;

a plurality of resistive switches connected to the input terminal and the first and second output terminals, the plurality of resistive switches further connected to an upper voltage and a lower voltage; and a resistive element connecting the first and second output terminals;

wherein a difference between the first and second voltage levels is less than one half of a difference between the upper voltage and the lower voltage; and a receiver circuit for converting the first and second output signals to a single ended output clock signal, wherein the plurality of resistive switches comprise:

a first N-channel MOS transistor having a drain connected to the upper voltage, a gate connected to the input terminal, and a source connected to the first output terminal;

a second P-channel MOS transistor having a drain connected to the lower voltage, a gate connected to the input terminal, and a source connected to the first output terminal;

third N-channel MOS transistor having a drain connected to the upper voltage, a source connected to the second output terminal, and a gate connected to the input terminal through an inverter; and a fourth P-channel MOS transistor having a drain connected to the lower voltage, a source connected to the second output terminal, and a gate connected to the input terminal through the inverter.

14. clock circuit, comprising:

a transmitter circuit comprising;

an input terminal for receiving an input clock signal;

first and second output terminals for transmitting first and second output signals having first and second voltage levels, respectively;

a plurality of resistive switches connected to the input terminal and the first and second output terminals, the plurality of resistive switches further connected to an upper voltage and a lower voltage; and a resistive element connecting the first and second output terminals;

wherein a difference between the first and second voltage levels is less than one half of a difference between the upper voltage and the lower voltage; and a receiver circuit for converting the first and second output signals to a single ended output clock signal;

wherein the resistive element comprises:

a MOS transistor having a drain connected to the first output terminal, a gate connected to a selected one of the upper voltage and the lower voltage, and a source connected to the second output terminal.

* * * * *

UNITED STATES PATENT AND TRADEMARK OFFICE

CERTIFICATE OF CORRECTION

PATENT NO. : 6,294,933 B1
DATED : September 25, 2001
INVENTOR(S) : Christopher Ky Chun et al.

It is certified that error appears in the above-identified patent and that said Letters Patent is hereby corrected as shown below:

Column 9,
Line 20, delete second "an" and add -- and --.

Column 10,
Line 56, before "clock" add -- A --.

Signed and Sealed this

Fourth Day of June, 2002

Attest:

JAMES E. ROGAN

*Attesting Officer* *Director of the United States Patent and Trademark Office*